United States Patent [19]

Arps et al.

[11] Patent Number: 4,792,954
[45] Date of Patent: Dec. 20, 1988

[54] CONCURRENT DETECTION OF ERRORS IN ARITHMETIC DATA COMPRESSION CODING

[75] Inventors: Ronald B. Arps, San Jose, Calif.; Ehud D. Karnin, Kiriat-Motzkin, Israel

[73] Assignee: International Business Machines Corporation, Armonk, N.Y.

[21] Appl. No.: 925,433

[22] Filed: Oct. 31, 1986

[51] Int. Cl.[4] ............................................. G06F 11/00
[52] U.S. Cl. ...................................... 371/48; 341/94
[58] Field of Search ...................... 371/37, 30, 48; 340/347 DD

[56] References Cited

U.S. PATENT DOCUMENTS 4,467,317 8/1984 Langdon, Jr. et al. ............. 340/347

OTHER PUBLICATIONS

"The Elements of Complex Analysis", B. Choudhary, Department of Mathematics, Indian Institute of Technology, Delhi, John Wiley & Sons.
Peterson & Weldon, Error–Correcting Codes, 2nd Ed., The MIT Press, Cambridge, Mass., 1972, pp. 449–465.
"Mathematical Analysis", Tom M. Apostol, California Institute of Technology, Addison-Wesley Publishing Company, 1974.

*Primary Examiner*—Charles E. Atkinson
*Attorney, Agent, or Firm*—Brown, Martin, Haller & Meador

[57] ABSTRACT

Method and means for detecting any single errors introduced into an arithmetic data compression code string as a result of coding, transmission, or decoding through testing according to a modulo-n function, n being an odd number not equal to +1 or −1, an arithmetic compression coded data stream C'(s) genmerated by n-scaling an arithmetically recursive function that produces a non-scaled arithmetically data compressed code stream C(s) as a number in the semi-open coding range [0,1].

14 Claims, 4 Drawing Sheets

CONCURRENT DETECTION OF ERRORS IN ARITHMETIC DATA COMPRESSION CODING

BACKGROUND OF THE INVENTION

This invention relates to detecting single-bit errors occurring in an arithmetic data compression code string C(s), embodied as a number in the semi-open coding range [0,1], the code stream C(s) being computed according to an arithmetically recursive function. More particularly, the invention relates to detection of single-bit errors produced by an arithmetic encoder, introduced into the code channel, or produced by an arithmetic decoder. Detection of such single-bit errors is enabled by n-scaling of the recursive function to produce a compressed binary representation C'(s) in the semi-open coding range [0,1] and testing C'(s) by a modulo-n function for a non-zero residue.

Arithmetic compression codes are established in the prior art and may be understood for the binary source case by reference to Langdon and Rissanen, "A Simple General Binary Source Code," IEEE Transactions On Information Theory, Volume IT-29, No. 5, September 1982. The following issued United States patents trace the development of arithmetic data compression coding, and are incorporated herein by reference: U.S. Pat. No. 4,122,440, of Langdon, Jr. et al.; U.S. Pat. No. 4,286,256, of Langdon, Jr. et al.; U.S. Pat. No. 4,295,125, of Langdon, Jr.; and U.S. Pat. No. 4,467,317, of Langdon, Jr. et al. These references generally relate to the theory of arithmetic compression coding and offer a number of encoder embodiments useful for operating on unencoded data streams drawn from binary alphabets.

As taught in U.S. Pat. No. 4,467,317, high-speed arithmetic data compression coding is a sequential process that recursively adds augends to the significant end of a so-far generated code string C(s) in response to an unencoded data string s. As stated in the referenced patent, the coding process depends upon coding parameters provided by a statistical model of the string. (As in the past, the inventors here are concerned only with the process of coding, the modeling process being well understood. Arithmetic data compression coding generates an arithmetic code stream C(s) which is a number contained in the semi-open coding range [0,1]. In the general case, the source string s=m(1), m(2), . . . , (m) (i), . . . consists of m-ary symbols (m). The next symbol, m(i) in s to be encoded has a joint probability that depends upon the probability of the portion of s that has preceded m(i). It should be evident that m(i) occurs further toward the end of the string s, its joint probability declines. Operatively, the arithmetic coding process reflects this attenuation of the joint probability of i by successively subdividing the available coding range. A subinterval of the range corresponding to the portion of the string s predecing m(i) that has already been encoded is defined by a lower bound, C(s), positioned in the range, and a value A(s) that sizes the subinterval. Thus, the subinterval corresponding to the portion of the coding range available to encode m(i) is expressed as [C(s),C(s)+A(s)].

During the cycle of the recursive function in which the next symbol m(i) is encoded, the subinterval magnitude A(s) is subdivided into as many parts as there are source symbols, with each part's magnitude corresponding to the conditional probability of the source symbol represented. The augend, the value added to C(s) to encode the next symbol m(i), is the sum of the conditional probability magnitudes of the symbols preceding m(i) in the source alphabet. This, of course implies the imposition of some prearranged order on the source alphabet, and in the binary source coding construct of U.S. Pat. No. 4,467,317, this arbitrary order is: LPS (least-probable symbol), MPS (most-probable symbol).

Subdivision of A(s) for the purpose of encoding the next symbol m(i) requires partitioning the present interval size A(s) into as many parts as there are symbols in the source alphabet. In the art, the mangitudes of the subdivisions are approximated according to a control parameter k provided by the source model. For the binary source alphabet, two sizes result from subdividing A(s), with one being assigned to the MPS and the other to the LPS. The prior art subdivision operation results in the following specific magnitudes:

size 1: $A(s) \cdot (1 = 2^{-k})$ (1a)

size 2: $A(s) \cdot 2^{-k}$ (1b)

resulting in the following subinterval coding:

IF LPS:

[C(s), C(s)+size 1] (2a)

If MPS:

[C(s)+size 1, C(s)+size (2)] (2b)

As can be seen from inspection of the MPS subinterval structure, an augend, size 1, is added to C(s) to form a new lower bound.

Equations (2a) and (2b) imply that the action of an arithmetic encoder is sequential in the sense that a coding step is undertaken in response to each symbol in the string s. Further, the procedure is recursive in the sense that the resulting code string value C(s) and the current subinterval magnitude A(s) are modified each step to a value determined by their respective values at the end of the previous step.

The prior art arithmetic data compression coding recursions for the binary alphabet are as follows:

For each MPS:

$C(s \cdot MPS) = C(s) + 2^{-k}$ (3a)

$A(s \cdot MPS) = A(s) - 2^{-k}$ (3b)

For each LPS:

$C(s \cdot LPS) = C(s)$ (3c)

$A(s \cdot LPS) = 2^{-k}$ (3d)

In this prior art, decoding involves recursive examination of the magnitude of the most significant part of the code string C(s) and determining whether the current augend exceeds the remaining numerical value of the code string. Each such examination involves a trial subtraction in which the augend is tentatively subtracted out of the code string. If the trial result is negative, the subtraction is nullified and the current symbol is decoded as LPS, otherwise, the subtraction is let stand and the symbol is decoded as MPS.

The algorithm for compressing and decompressing the string s involve the execution of binary numeric methods to produce C(s) and to recover the decoded string s. As is known, the procedures employed to encode and decode according to the recursions 3(a)–3(d) result in high-entropy code strings, which provide no evidence to decude whether the string was subject to random errors. Since, it is expected that, in the usual operational environments, an encoded data stream will be subjected to error sources which will corrupt its information content, it is essential to provide a means for protecting the integrity of the information. One means of detecting potential errors within an arithmetic encoder, an arithmetic decoder, and a channel over which an arithmetic code string is transmitted is suggested by "AN" arithmetic error coding. "AN" arithmetic error coding is a technique in which a first integer N, is encoded by multiplying it with a constant second integer A, to increase its redundancy and thereby obtain error protection. Inspection of the first integer's AN representation by dividing it with the second integer, will reveal errors in the first integer when the result of such a division does not have a remainder of zero. Note that the second integer, A, must be odd and not equal to 1 in order to provide single error detection. To avoid confusion with earlier use of the symbol "A" in arithmetic compression coding, we will hereafter use the symbol "n" to represent the integer multiplication factor normally called "A" in "AN" arithmetic error coding. We will continue to use the established conventions in these fields for positioning the binary point when describing a code stream as a binary number: (1) For arithmetic compression coding the binary point is left of the most-significant-bit of the code stream; (2) For arithmetic error coding the binary point is right of the least-significant-bit of the code stream.

SUMMARY OF THE INVENTION

An object of this invention, therefore, is to provide method and means for detecting potential errors within coding strings produced by arithmetic data compression coding.

A further objective is to utilize the technique of arithmetic error encoding to assist in such detection.

The technical difficulty met by this invention is that of protecting data integrity in the binary representations of arithmetically compressed code strings, even during their encoding and decoding processes. The problem is that of evaluating the integrity of arithmetically-compressed strings at all the critical points of string coding, transmission, and decoding. In the architecture of systems that require arithmetic compression of data, concern is often expressed regarding the ability of the system to detect errors in all of the code data stream path parts, including the coder and the decoder as well as the transmission channel between them. The invention provides this ability without requiring total decompression of the code string. This error detection ability entails the very low cost of increasing the bit count of an arithmetically-encoded stream by one to two bits. The simplicity of the procedure and the additional implementing hardware enhances the significance of the invention and makes the added cost trivial in comparison.

The invention is understood as a method for detecting single-bit errors during the recursive machine encoding of an m-ary symbol string s to produce a compressed binary number C(s) as a representation of s, C(s) being a number in the semi-open interval [0,1], the interval being successively subdivided during successive encoding cycles, each subinterval being defined by its lower bound C(s) and a coding variable A(s) to be [C(s),C(s)+A(s)]; the values of C(s) and A(s) being computed as arithmetically recursive functions of C(s) and A(s), respectively. The method is expressed in the following steps: scaling the arithmetically recursive function by n, n being an odd number not equal to + or −1; transforming s into a compressed binary representation C'(s) in the semi-open interval [0,1], according to the n-scaled arithmetically recursive function; and testing C'(s) by a modulo-n function for a non-zero residue.

The invention is founded on the critical observation that the method of arithmetic encoding involves a recursive function operating on a semi-open coding interval [0,1]. Since arithmetic error coding basically involves the sequential multiplication of integer operands by a second constant integer, error coding insertion can be synchronized with the sequential performance of the recursive arithmetic compression function. Further, the error coding is free to select any constant integer for n from the set of all odd integers not equal to one, since the compression coding function operates on an interval bounded by 0 and 1 which can without loss of generality be n-scaled to be bounded by 0 and n. Finally, the architecture of prior art arithmetic coders being based on serially-connected, functionally discrete units; the redundant error coding integer n can be multiplied with an early parametric representation of the codewords (augends) that build up the code, thereby permitting all portions of the coder downstream from such parametric representation to be error-checked.

In this regard, the invention is also embodied in an arithmetic encoder of the type response to a symbol string s and to coding parameters representing the conditional probabilities of the symols of s=m(1), m(2), . . ., m(i), . . . at their locations in s. Such an encoder produces an arithmetically-encoded representation C(s) of s, C(s) being a number in the semi-open range [0,1]; the encoder includes a binary register C for containing the working end of the portion of C(s) resulting from the encoding of the portion of s preceding the next symbol m(i), a binary register A for computing a normalizing factor, and an arithmetic logic unit (ALU) responsive to a coding variable A(s) for the next symbol m(i) for numerically adjusting the contents of C and A based on the conditional probabilities of i at its position in s and for shifting the contents of C and A in a predetermined magnitude direction based on the adjusted contents of A, such that C(s) includes the successive shifted contents of C. The improvement to the encoder includes means for scaling the coding variable for the next symbol m(i) by n, n being an odd prime number not equal to + or −1; and a modulo-n unit for testing the contents of C according to a modulo-n function for a non-zero residue indicative of single-bit errors.

It will be evident that the objectives of the summarized invention are achieved together with other benefits when the following detailed description is read in conjunction with the below-described drawings.

DETAILED DESCRIPTION OF THE PREFERRED EMBODIMENT

Figure 1:
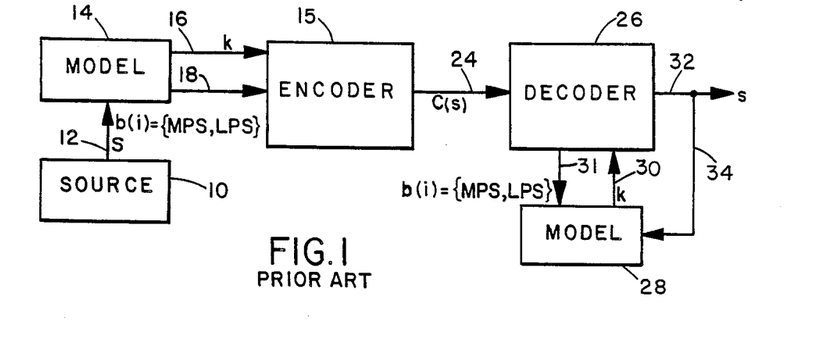
FIG. 1 is a block diagram illustrating the interface of an unencoded binary source symbol stream s with its arithmetically-encoded representation C(s) and the inverse interface of C(s) with its decoded stream S.

FIG. 1 illustrates a block diagram of a system for arithmetically compressing an unencoded source symbol stream s. A binary signal source 10 provides the unencoded source stream $s = b(1), b(2), \ldots, b(i), \ldots$ on a single line 12 to a statistical modeling unit 14 and an encoder 15. As is known, the modeling unit 14 operates on the occurrence history of the symbol stream s to provide a control parameter k on a single line 16. The parameter k corresponds to the conditional probability of an LPS for the next symbol b(i) in the symbol stream s. Viewed from another aspect, the parameter k indicates the probability interval used for subdividing the current coding range. An indication is provided on signal path 18 to signify that the next symbol b(i) is equal to a predetermined symbol $b_m$ in the source alphabet from which the symbols of the stream s are drawn. In the arithmetic coding prior art regarding binary symbol streams, the indication on line 18 indicates whether the symbol to be encoded is either the most probable (MPS) or the least probable (LPS). The encoder 15 implements a recursive arithmetic function to produce the encoded stream C(s) in response to the inputs on lines 16 and 18. The coded stream is transported on signal line 24 to an arithmetic decoder 26 operating in conjunction with a modeling unit 28 to extract the symbol stream s from the encoded stream C(s). In this regard, the modeling unit 28 corresponds to the modeling unit 14 in that it estimates the LPS symbol probability and provides the estimate in the form of a parameter k on the signal line 30. The decoder unit 26 also provides an indication of whether the currently-decoded symbol is MPS or LPS on signal line 31. The decoded symbol stream s is output from the decoder 26 on signal line 32 and fed back on signal line 34 to the modeling unit 28.

In the prior art, the encoder 15 implements the recursions (3a)–(3d) for the next symbol b(i) of the symbol stream s (present on signal line 18) in response to the probability value provided by the modeling unit 14 on the signal line 16. The action of the encoder is binary. Thus, the interval representations for C(s) and A(s) are expressed as binary numbers. As taught in U.S. Pat. No. 4,467,317, it is necessary to maintain the alignment of the binary expressions for A(s) and C(s) in order to add the augend to the current code string at the proper place. Once addition is completed, the "working end" of the code string C(si), encompassing the w least significant bits of the string, is realigned to move the completed significant bits of the code string out of the working location of the encoder. Renormalization and realignment are accomplished in an procedure that reduces the required arithmetic operations to a minimum complement. If b(i)=LPS, the unnormalized subinterval in equation (3d) is $2^{-k}$, expressed in binary form as $0.00 \ldots 0100$. Normalization of the variable A(sLPS) to $1.00 \ldots 0$, requires shifting the binary representation of $2^{-k}$ to the left by k positions. The unnormalized significant bits of the code string C(sLPS) are unchanged from the previous cycle and require only a k-bit shift leftward. When the next symbol b(i) is MPS, the value of the coding variable A(sMPS) is given by equation (3b) and the unnormalized code string is given by (3a). If equation (3b) reduces the value of A(sMPS) to less than one, it can be renormalized by shifting left one bit resulting in realignment of the significant end of the code string. This also requires shifting C(sMPS) in lock step with A(sMPS).

In this case, where the source string s is binary, arithmetic data compression coding according to the recursions of (3a)–(3d) can be carried out in terms of two registers, A and C, according to the following algorithm:

ARITHMETHIC CODING ALGORITHM

Initialization:
$A \leftarrow 1.000 \ldots 0_{(binary)}$
$C \leftarrow 0.000 \ldots 0_{(binary)}$
if next symbol b(i)=MPS, then
$A \leftarrow A - 2^{-k}$
$C \leftarrow C + 2^{-k}$
and, if $A < 1$, renormalization is executed as:
$A \leftarrow 2A$
$C \leftarrow 2c$
if next symbol b(i)=LPS, then
$A \leftarrow 2^{-k}$
and C and A are shifted in unison
until the contents of $A = 1.00 \ldots 0_{(binary)}$ In performing the explicated encoding algorithm, the registers A and C are initalized to define the above-described semi-open coding interval [0,1]. Then, if the next symbol b(i)=MPS, the k parameter provided by the modeling unit 14 is converted to $2^{-k}$, which is subtracted from the contents of A and added to the contents of C. Then, the contents of A are inspected and, if less than 1, A and C are shifted in lock-step by one bit. Assuming that A and C are conventional binary registers, whose contents are interpreted in high-to-low order position magnitude, the shifting operation results in conventionally serially shifting the contents of A and C in the direction of greatest magnitude. Similarly, if next symbol i=LPS, the contents of A are simply reinitialized, while the contents of C are shifted in the high-magnitude direction by k places. The bits successively shifted from the high-magnitude end of register C form the code string C(s).

Figure 2:
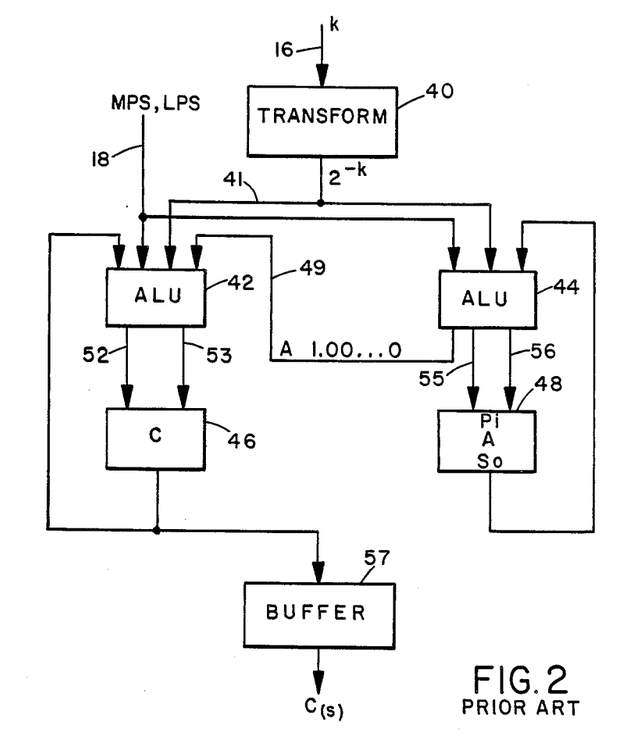
FIG. 2 illustrates a block diagram of the binary source arithmetic compression encoder of FIG. 1.

FIG. 2 illustrates an embodiment of a prior art arithmetic encoder that operates according to the proposed encoding algorithm. In the prior art encoder, the parameter k is provided to a transform unit 40 which produces the value $2^{-k}$ on signal line 41. This value, together with the MPS/LPS indicator on signal line 18, is provided to a pair of conventionally-structured arithmetic logic units (ALU) 42 and 44. The ALU's 42 and 44 operate on the contents of the C and A registers 46 and 48, respectively. The ALU 42 also receives as inputs the contents of the register 46 and an indication from the ALU 44 on signal line 49 when the contents of the A registers are less than 1. The ALU 42 parallel-loads the augmented value of C(si) into the register 46 on signal line 52, and then shifts the contents of the register in the high-magnitude direction according to a shift-control signal on signal line 53. The ALU 44 performs all of the arithmetic and logical operations necessary to manipulate the contents of the register 48, and provides the updated contents on signal line 55. The contents of the register 48 are then shifted in the high magnitude direction according to a shift control signal on signal line 56. In addition, the ALU 44 provides the indication on signal line 49 when the encoding of an MPS would result in an A-register content magnitude less than 1. The prior art also discloses a buffer 57 for manipulating the code string produced by shifting the contest of the register 46. Such manipulations include construction of fixed-length code string segments as well as bit-stuffing to account for a carryover in the arithmetic operations affecting the contents of C.

The method of the invention is based on the observation that the encoding procedure and mechanism of the prior art can be adapted through scaling by the value n. The resulting algorithm, like the original one, still compresses the source stream s by successively subdividing the available coding space according to the probabilities of the incoming signals. However, while the prior art algorithm begins by dividing the semi-open range [0,1], the new procedure starts with the semi-open coding range [0,n]. Therefore, if, for example, the first symbol is an LPS, it is assigned the subinterval $[0, n \cdot 2^{-k}]$, whereas with the original algorithm it got only $[0, 2^{-k}]$ for the same probability indicated by the parameter k. In general with m-ary source alphabets, for encoding the i'th symbol, the adapted algorithm ends with a coding interval $[na_i, nb_i]$, if the original algorithm yielded $[a_i, b_i]$. The adapted algorithm produces a code C'(s) which, when viewed as a number, is exactly n times larger than the unadapted. This produces a code-string length that differs from the old by an increase of only $\log_2 n$ bits.

In summary, the adaption of the arithmetic compression algorithm for error encoding is as follows:

ADAPTED CODING ALGORITHM

Initialization:
$A' \leftarrow n.00 \ldots 0_{(binary)}$
$C' \leftarrow 0.00 \ldots 0_{(binary)}$
if next symbol b(i)=MPS, then
$A' \leftarrow A' - n \cdot 2^{-k}$
$C' \leftarrow C' + n \cdot 2^{-k}$
and, if A<n, renormalization is executed as:
$A' \leftarrow 2A'$
$C' \leftarrow 2C'$
if next symbol b(i)=LPS, then
$A' \leftarrow n \cdot 2^{-k}$
and C' and A' are shifted in unison until
the contents of $A' = n.00 \ldots 0_{(binary)}$ The changes to the original algorithm represented by the adapted algorithm enable the detection of a single error in the encoding process. Assume that one bit of the C'(s) code stream is flipped by the encoder of FIG. 2. This would amount to a difference of $+2^j$ from the correct numeric value of the code string C'(s), when the code string is regarded as an integer. In the absence of errors, C'(s) represents an integer c' which is divisible by n, that is, c'=0 (modulo-n). When an error occurs, $c' + 2^j = 2^j$ (modulo-n), and since for any j, $2^j \neq 0$ (modulo-n), errors will be detected by observing a non-zero residue. It will be evident to the skilled artisan that, although multiple errors are not guaranteed to be detected (for example, $2^j + 2^{J-1} = 0$ (modulo-n)), there is still a ⅔ chance for detection.

Figure 3:
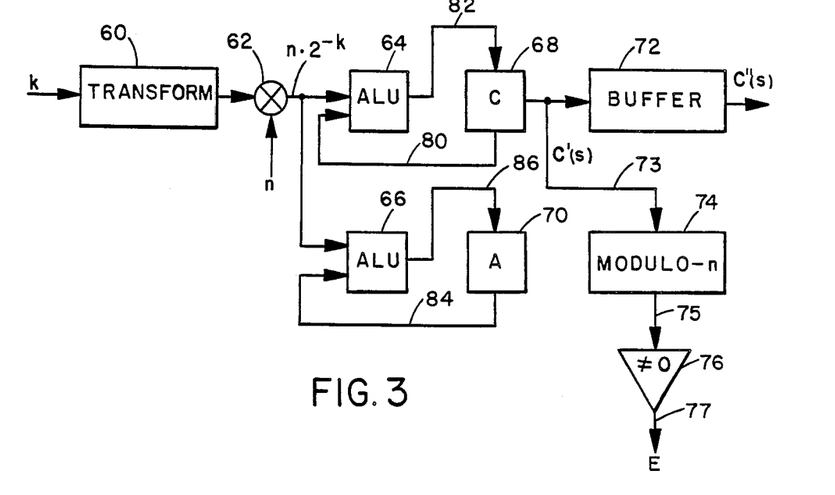
FIG. 3 illustrates a block diagram of the FIG. 2 encoder adapted for practicing the invention.

Preferably, the encoder of FIG. 2 is adapted according to FIG. 3 for practicing the invention. In FIG. 3, a transform unit 60 receives the parameter k and provides the parameter $2^{-k}$ to a conventional multiplier circuit 62 which scales the value by n to produce $n \, 2^{31 \, k}$. The multiplier circuit 62 can be a conventional multiplier synchronized to the operations of the decoder 60. Alternatively, the transform unit 60 can absorb the operations of the multiplier circuit 62 to form a compound transform unit which would produce the scaled value $n \, 2^{-k}$ directly. This can be implemented, for example, in a read-only memory (ROM) look-up table. The scaled coding variable is provided to a pair of ALU's 64 and 66, which operate in the same manner as the corresponding ALU's in FIG. 2 to control the C and A registers, indicated by reference numerals 68 and 70, respectively, according to the adapted algorithm described above. Now, the shifting operations performed on the contents of the C register 68 produce a code string C'(s) representing the multiplication by n of the code string C(s) obtained by the unadapted coding algorithm. A buffer 72 may be provided for the purposes of bit stuffing and byte assembly described above, yielding the modified code string C"(s). For error-checking purposes, the scaled code string C'(s) is serially conducted on signal line 73 to a serial modulo-n circuit 74 which inspects the scaled code string for a non-zero residue. The circuit 74 can comprise, for example, a modulo-n divider which produces a remainder R on signal line 75. The remainder R is tested by a conventional comparator 76 for a non-zero value. When the modulo-n division of the circuit 74 results in a non-zero remainder $R \neq 0$, the comparator 76 provides an error E indication on signal line 77. It should be evident that the test circuit comprising the modulo-n divider 74 and the comparator 76 can be replicated in parallel or serial form and placed at any preselected strategic location to test for non-zero residue in the formation, transmission, or decoding of the scaled code stream C'(s). Thus, for example, the contents of the C register 68 can be parallel tested in the feedback path 80 between the register and the ALU 64, as can the output of the ALU 64 when transferred to the C register 68. Furthermore, it should be evident that the old and new contents of the A register can be tested for error by inserting a parallel modulo-n tester in each of the signal lines 84 and 86, respectively. The inputs to the A and C registers from the multiplier unit 62 can also be tested by a parallel modulo-n tester. Finally, a modulo-n test circuit can be provided at the output of the buffer 72 to error-test the output of the coder of FIG. 3 if bit-stuffing is done appropriately to preserve C"(s) mod n=0. Thus, it should be evident that the operational reliablility of the coder of FIG. 3 can be enhanced by early detection of single-bit errors anywhere in the code stream from the output of the multiplier 62 or a compound transform unit to the output of the buffer 72.

The modulo-n unit 74 can be structured in a variety of ways to test for modulo-n residue. For example, a serial modulo-n unit can be structured as a serial unit to perform bit-by-bit division of the serial representation of the code stream C'(s). Alternatively, the unit 74 can be built and operated as a parallel divider to perform test operations on the contents of the C and A registers and the parallel outputs of the ALU's 64 and 66. In this case, it will be evident that this single-error checking methodology can also be used to check serially-created multiple-bit errors in the generation of the stream C'(s). An exemplary embodiment of a bit-by-bit serial tester embodiment of the unit 74 can be understood with reference to FIGS. 4 and 5, where it is assumed that n=3.

Figure 4:
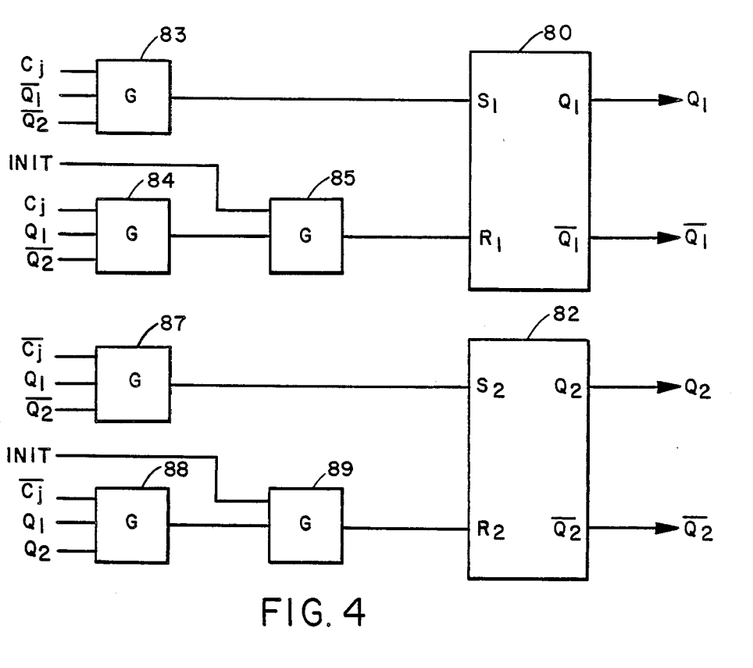
FIG. 4 illustrates the logic of a three-state machine for serially monitoring an arithmetically error-encoded stream for a modulo-3 non-zero residue.
Figure 5:
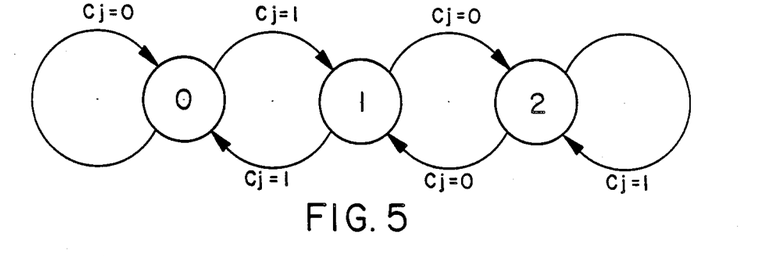
FIG. 5 is a state diagram of a multi-state machine for testing modulo-3 for a non-zero residue in a binary code stream.

In FIG. 4, a pair of set-reset (S-R) flip-flops 80 and 82 each have complementary outputs $Q_1/\overline{Q}_1$ and $Q_2/\overline{Q}_2$, respectively. The state of the flip-flop 80 is conventionally determined by the outputs of the gates 83-85. Similarly, the states of the flip-flop 82 result from the outputs of the gates 87-89. The flip-flops 80 and 82 form a three-state machine that serially tests the current symbol $c_j$ of the n-scaled code stream C'(s). The FIG. 4 n-state machine is configured as a three-state machine assuming, as stated above, that n=3 in the encoder of FIG. 3. The states defined by the flip-flops 80 and 82 are taken as: state 0=00 ($\overline{Q}_1$, $\overline{Q}_2$=1); state 1=10 ($Q_1$, $\overline{Q}_2$=1); and state 2=11 ($Q_1$, $Q_2$=1). The transitions between the states are shown in FIG. 5 by the arrows interconnecting the states. It is further assumed for the purposes of the example, that the initial state is state 0, that is, that the flip-flops 80 and 82 are initially reset at the same time the contents of the A and C registers are initialized according to the adapted algorithm. Then, as the n-scaled code stream is produced by successive shifting of the C register, the bits shifted out of the C register are provided as the inputs to the gates 83, 84, 87, and 88. The resulting states of the flip-flops 80 and 82 are determined by the condition of their outputs (that is, by the current state of the three-state machine). At the end of each completed code string from the adapted coding algorithm, the state of the three-state machine of FIG. 4 is inspected. If the three-state machine is in any state but state 0, the comparator 76 provides the error E indication.

Essentially, the three-state machine of FIG. 4 detects encoder errors by determining the residue of c(modulo-3), where c is the accumulated numeric value from the output of the encoder during the current coding cycle. Since both of the above algorithms provide a first-in-first-out code, built up with its most significant bit first, the three-state machine of FIG. 4 advantageously computes the residue concurrently with computation of the code. In the state transition diagram of FIG. 5, each state is designated as a possible current residue. Thus, in state 0, the residue is 0, in state 1 the residue is 1, while in state 2 the residue is 2. It should be noted that if bit-stuffing is implemented in the buffer 72, the three-state machine of FIG. 4 can be adapted by the bit stuffer to accommodate the slight changes in the code stream C'(s). However, to guarantee that the code stream C"(s), after bit stuffing in the buffer 72, has a residue of 0 when it is error-free (i.e., C"(s) $\mod_n$=0) requires that bi bits be stuffed containing one of p=0,1,2, . . . ,P permissible binary states. For n odd and not equal to +1 or -1, b must be a positive integer such that $2^{}b-1=P\cdot n$, an integer multiple of n. The permissible states for a given set of b bits are of the form p·n, with P·n<$2^{}b$-1.

For example, if n=3, b=all positive integer multiples of 2. For b=2, P=1 and p={00,11}. Similarly, if n=5, b=all positive integer multiples of 4. For b=4, P=3 and p={0000,0101,1010,1111}.

Figure 7:
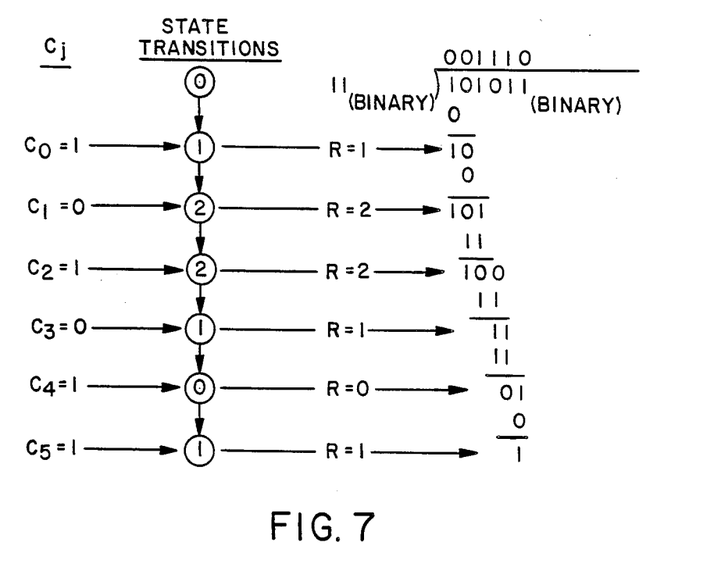
FIG. 7 illustrates an example of error-checking an arithmetically error-encoded data stream.

To clarify the way the three-state machine of FIG. 4 operates, consider the example of dividing by three the code string c=101011. The conventional division is illustrated in FIG. 7, with the code string c in binary representation being divided by the value $11_{(binary)}$, equivalent to $3_{(decimal)}$. As shown in FIG. 7, R of each step of the division is indicated by the state of the FIG. 4 three-state machine. In turn, the state of the three-state machine is determined by the current symbol $c_j$ of the symbol stream in combination with the prior state of the machine. Thus, the machine of FIG. 4 is initialized to state 0 and transitions, with the first bis ($c_0$=1) to state 1. The fact that the last state is tate 1 is indicative of either an incomplete code string or an error in a complete code string.

Decoding according to the prior art is easily understood by reference to FIG. 6 and the below-described decoding algorithm. Non-scaled decoding is done by initializing the w bit wide register C with the most significant w bits of the code string C(s), and setting A to 1.00 . . . 0. Then, for each incoming bit of the code string C(s), the decoding operation performed is based upon a trial subtraction of a coding variable. The symbol which is decoded depends upon the result of arithmetically testing the coding variable against the code string C(s). In the binary case, according to the prior art the test is: $C-2^{-k}$ where k is provided by the modelling unit). If $C-2^{-k}>0$, an MPS is decoded; then the contents of C and A are both reduced by $2^{-k}$. If this results in the contents of A being less than 1, renormalization occurs, with the most significant portion of C(s) shifted into C. If the difference is less than 0 an LPS is decoded, $2^{-k}$ is placed in A and both A and C are shited in unison, with the next k most significant bits of C(s) shifted into C, until A=1.00 . . . 0. The decoding algorithm is expressed as follows:

DECODING

Initialization:
  A←1.00 . . . 0
  C←(first w most significant bits of C(s))
  if $C-2^{-k}>0$, MPS decoded, and
    A←A−$2^{-k}$
    C←C−$2^{-k}$
  then, if A<1, shift A and C in unison, with most significant portion of C(s) shifted into C, until
    A=1.0 . . . 0; but
  if $C-2^{-k}<0$, LPS decoded, and
    A←$2^{-k}$
  and A and C shifted in unison, with the next k most significant bits of C(s) shifted into C, until
    A=1.00 . . . 0.

When the encoding operation is scaled to produce C'(s), the above described decoding alogorithm is adapted according to the invention as follows:

ADAPTED DECODING ALGORITHM

Initialization:
  A'←n.00 . . . $00_{(binary)}$
  C'←(first w most significant bits of C'(s))
  if $C'-n\,2^{-k}>0$, MPS decoded, and
    A'←A'−n·$2^{-k}$
    C'←C'−n·$2^{-k}$
  then, if A'<n.$0_{(binary)}$, renormalization is executed as
    A'←2A'
    C'←2C'; but
  if $C'-n\,2^{-k}<0$, LPS decoded,
    A'←n·$2^{-k}$
  and A' and C' are shifted in unison, with the next most significant bits of C'(s) shifted into C' until A'=1.00 . . . 0.

Figure 6:
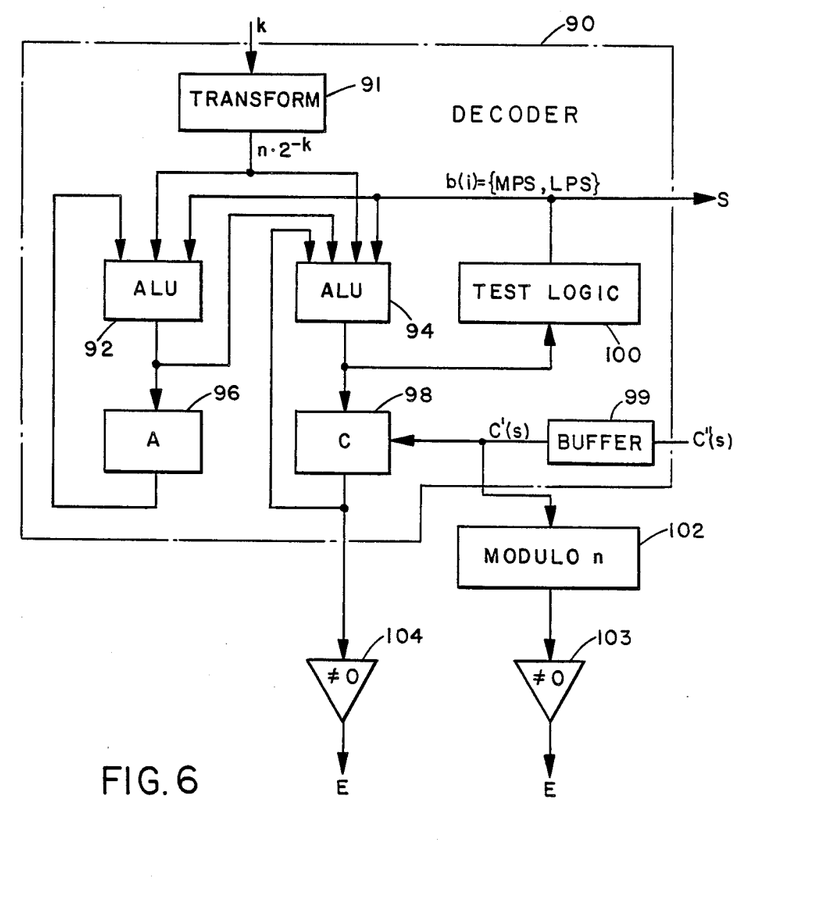
FIG. 6 is a block diagram of a binary source arithmetic compression decoder adapted for practicing the invention.

FIG. 6 illustrates a decoder 90 that accepts the n-scaled code stream C'(s) and decodes it according to the adapted algorithm described above. In this regard, the decoder 90 includes a combined n-scaling transform unit 91 that produces an augend $n \cdot 2^{-k}$ in response to k provided by a modeling unit (not shown). This n-scaled augend is provided to a pair of ALU's 92 and 94 that operate on the contents of the A and C registers, 96 and 98, respectively, according to the algorithm. A test logic circuit 100 tests the relationship of $C-(n \cdot 2^{-k})$ to 0 and makes the decoding determination whether the next symbol to be decoded equals MPS or LPS. A buffer 99, operating on the incoming modified code stream C''(s), may be provided for the purpose of byte disassembly and bit unstuffing, yielding the n-scaled code string C'(s). The C'(s) input to the decoder 90 can be tested according to the means described above for the encoder by a serial modulo-n circuit 102 producing a residue tested by a comparator 103. Similarly, the output of the C register in the form of bits serially shifted out in response to the shifting in of most significant bits of C'(s) can be provided to the comparator 104. Since the successive subtractions performed on the contents of the C register will result in the shifted-out bits being 0 if the decoder operates correctly, the comparator 104 is also useful for detecting decoder errors. Further, it should also be evident that the parallel register-sourced inputs and the parallel numerical outputs of the ALU's 92 and 94 can be parallel modulo-n tested in the manner described earlier.

It should be noted also that method and means for producing an arithmetic data compression code for a multi-character alphabet source stream is taught in U.S. patent application Ser. No. 825,831, dated Feb. 24, 1986, and now U.S. Pat. No. 4,652,856 issued 3/24/87 assigned to the assignee of this patent application, and incorporated herein by reference. The multi-character alphabet arithmetic encoder of U.S. Pat. No. 4,652,856 depends for its operation on statistics comprising occurrence counts of the symbols in an unencoded string. The occurrence counts are provided by a modeling unit to an encoder for encoding into the semi-open coding range [0,1]. The occurrence counts are related to the counting parameter k provided by the modeling unit for the binary source string, and support coding and decoding procedures which depend upon manipulation of an A and C register in a manner corresponding to that described above. Therefore, it would be evident to those skilled in the art that the invention described hereinabove with reference to a binary source stream could be practiced in the case of the invention taught in the incorporated United States patent application simply by scaling the semi-open coding range to [0,1] and scaling the occurrence counts by n. In this regard, precisely the same residue testing as that taught above for both the encoder and the decoder would be performed to detect errors in the coded stream.

For m-ary arithmetic compression coding, this description is also meant to cover other fixed, but arbitrary, orderings for the individual parts of the subinterval A(s). For example, instead of subdividing an interval with successive parts ordered by increasing conditional probabilities, the successive parts could easily be ordered by decreasing probabilities. Notwithstanding the previous descriptions of arithmetic coding where the subinterval is defined by [C(s),C(s)+A)], this description is also meant to cover the dual method where the subinterval is defined by the semi-open coding range [C(s)−A(S),C(s)]. For this dual, C(s) is an upper bound and is derived by subtracting the coding variables from an unscaled string initialized at 1.0. For the A-scaled codestring, the string is first initialized to A before subtracting any A-scaled subtrahends. The size of all unscaled or A-scaled subintervals are then computed as before. Decompression is accomplished by performing trial additions of the coding variables used in compression, to find the largest one that does not exceed the magnitude of the overall interval size (1.0; or A if error encoded).

Although the invention has been described with reference to a preferred embodiment, it will be understood by skilled artisans that changes in the taught method and apparatus may be made without departing from the scope or spirit of the invention.

We claim:

1. A method for detecting single-bit errors during the recursive machine encoding of a binary symbol string $s = b(1), b(2), \ldots, b(i), \ldots, b(n)$ to produce a compressed binary number c(s) as a representation of s, c(s) being a number in the semi-open interval [0,1], the interval being successively subdivided during successive encoding cycles, each subinterval being defined by its lower bound c(s) and a variable a(s) such that [c(s), c(s)+a(s)]; the values of c(s) and a(s) being computed as arithmetically recursive functions of c(s) and a(s), comprising the steps of:

scaling the arithmetically recursive functions by n, n being an odd number not equal to + or −1;

transforming s into a compressed error encoded binary representation C'(s) in the semi-open interval ([0,n] according to said n-scaled arithmetically recursive functions; and testing C'(s) by a modulo-n function for a non-zero residue.

2. The method of claim 1 wherein the interval [0,1] is successively subdivided according to a succession of values assumed by a coding variable, each coding variable value indicative of the amount by which the current subinterval is to be subdivided to obtain the next subinterval, and said step of scaling includes multiplying said coding variable by n.

3. The method of claim 1 wherein said step of testing includes dividing C'(s) by n.

4. A method for detecting single-bit errors during the recursive machine modification of a string C(s) of binary numbers to produce C(si) where C(si) is a compressed representation of an m-ary symbol stream $s = m(1), m(2), \ldots, m(i), \ldots$ and is responsive to the next symbol m(i) in s, C(si) being a number in the semi-open coding range [0,1], the coding range being subdivided into intervals during successive machine string modification cycles, each interval being defined by its lower bound C(s) and an interval parameter A(s) such that (C(s), C(s)+A(s)), said method being executable on a pair of binary registers C and A, each having a finite dimension, w, comprising the steps of:

placing initial contents in registers A and C;

for the next symbol m(i) in the string s, reading in a coding variable corresponding to the conditional probability of m(i) at its location in the string s;

scaling said coding variable by n, n being an odd number not equal to + or −1;

altering the contents of C and A based upon said scaled coding variable and shifting the contents of C and A in a predetermined direction; and testing the contents of C by means of a modulo-n function for a non-zero residue.

5. The method of claim 4 wherein said step of testing includes testing the contents of C while said contents are being shifted.

6. The method of claim 4 wherein said step of testing includes testing the contents of C before said contents are shifted.

7. The method of claim 4 further including the step of testing the contents of A by means of a modulo-n function for a non-zero residue.

8. The method of claim 4 wherein the initial contents of A are n.0000.0 and the initial contents of C are 0.0000 ... 0.

9. In an arithmetic encoder of the type responsive to an m-ary symbol string s=m(1), m(2), ..., m(1), ... and to coding variable values representing the conditional probabilities of the symbols of s at their locations in s that produces an arithmetically-encoded representation C(s), C(s) being a number in a semi-open coding range between 0 and 1, said encoder including a binary register C for containing the working end of the portion of C(s) resulting from the encoding of the portion of s preceding the next symbol m(i), a binary register A for containing a normalizing factor, and an arithmetic logic means responsive to the coding parameter for the next symbol m(i) for numerically adjusting the contents of C and A based on the conditional probability of m(i) at its position in s and for shifting the contents of C and A in a predetermined magnitude direction based on the adjusted contents of A, such that C(s) includes the successive shifted contents of C, the improvement comprising:

means for scaling the coding variable value for m(i) by n, n being an odd number not equaling + or −1; and modulo means for testing the contents of C according to a modulo-n function for a non-zero residue.

10. The apparatus of claim 9 wherein said modulo means tests the contents of C while said contents are being shifted.

11. The apparatus of claim 9 wherein said modulo means tests the contents of C before said contents are shifted.

12. The apparatus of claim 9 further including modulo means for testing the contents of A according to a modulo-n function for a non-zero residue.

13. The apparatus of claim 9 wherein said arithmetic logic means includes means for initially setting the contents of C at 0.0 and the contents of A at $n_{(binary)}.0$ prior to the encoding of the first symbol in s.

14. In an arithmetic decoder of the type which receives an arithmetically-compressed binary symbol string and generates therefrom successive symbols b(i) of a binary symbol string s=b(1), ..., b(i), ..., b(n) by generating a trial coding variable based upon a coding parameter (k), arithmetically testing the trial coding variable against the w most significant bits of the compressed string, and decoding the next symbol b(i) of the string s based upon the outcome of the testing, wherein the arithmetically compressed binary symbol string C'(s) is a number in a semi-open interval between 0 and n, n being an odd number not equal to + or −1, the improvement comprising:

means for scaling the trial augend by n; and modulo means for testing C'(s) prior to the generation of b(i).

* * * * *